United States Patent
Reece et al.

(10) Patent No.: US 7,216,821 B1
(45) Date of Patent: May 15, 2007

(54) NON-CONTACT HANDLING DEVICE

(75) Inventors: Mark Reece, Albuquerque, NM (US);
Gerald A. Knorovsky, Albuquerque, NM (US); Danny O. MacCallum, Edgewood, NM (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 10/859,179

(22) Filed: Jun. 3, 2004

(51) Int. Cl.
*B05B 1/30* (2006.01)
*B05B 1/34* (2006.01)
*B05B 1/26* (2006.01)
*B05B 1/14* (2006.01)
*F02M 61/00* (2006.01)

(52) U.S. Cl. .............. 239/533.1; 239/533.12; 239/461; 239/497; 239/553.5; 239/554

(58) Field of Classification Search ........... 239/533.1, 239/533.12, 461, 482, 497, 505, 504, 553.5, 239/554
See application file for complete search history.

(56) References Cited

U.S. PATENT DOCUMENTS

| | | | | |
|---|---|---|---|---|
| 2,127,188 | A | * | 8/1938 | Schellin .................. 239/440 |
| 5,186,620 | A | * | 2/1993 | Hollingshead ............ 431/354 |
| 5,511,725 | A | * | 4/1996 | Barker et al. .............. 239/8 |
| 6,245,032 | B1 | * | 6/2001 | Sauer et al. ............... 601/162 |

* cited by examiner

*Primary Examiner*—Davis Hwu
(74) *Attorney, Agent, or Firm*—Jim C. Durkis; Dickson Kehl; Paul A. Gottlieb

(57) ABSTRACT

A pressurized fluid handling nozzle has a body with a first end and a second end, a fluid conduit and a recess at the second end. The first end is configured for connection to a pressurized fluid source. The fluid conduit has an inlet at the first end and an outlet at the recess. The nozzle uses the Bernoulli effect for lifting a part.

4 Claims, 1 Drawing Sheet

NON-CONTACT HANDLING DEVICE

The United States Government has rights in this invention pursuant to Contract No. DE-AC04-94AL85000 between the United States Department of Energy and Sandia National Laboratory.

BACKGROUND OF THE INVENTION

1. Field of the Invention

The present invention relates to the field of pressurized gaseous fluid pickup devices. Particularly, the present invention relates to a pressurized gaseous fluid pickup devices used for picking up a component without physical contact. Even more particularly, the present invention relates to a pressurized gaseous fluid pickup device that holds a component in a spaced position.

2. Description of the Prior Art

The rapid and expanding technologies that produce and use small to micro size devices have special requirements for handling small size scale objects. Examples of these objects are VLSI chips, packages, microsensors, rotors, gears, linkages, pins, biological specimens, analytical specimens, and the like. The tiny size and fragile nature of these objects make them difficult to handle by conventional means such as tweezers, vacuum chucks, magnetic or electrostatic chucks, etc. These types of objects are susceptible to damage or contamination. Further, it is often difficult to release very small parts because of stiction forces. Stiction force is defined as those forces that tend to cause very small parts to stick to the handling device after attempted release of the small part. Without knowing the specific situation of the part and handling device being used, it is noted that these forces may be caused by electrostatic, electromagnetic, Van der Waals, or surface tension phenomena that develop between the handling device and the small part.

There have been developed handling technologies based on the use of the Bernoulli principle, which states that an increase in the speed of a fluid produces a decrease in pressure and a decrease in the speed produces an increase in pressure. These handling techniques involve the use of a pressurized fluid passing over a part to be handled. The part typically increases the speed of the pressurized fluid over the part as the part approaches the nozzle of the pressurized fluid.

U.S. Pat. No. 3,466,079 (1969, W. K. Mammel) discloses a pressurized fluid pickup device that consists of a planar head with a central orifice through which fluid under pressure is applied to a workpiece. The pressurized fluid is directed away from the workpiece at the head's periphery. A plurality of circumferential projecting lugs or a circumferential projecting rim are used to prevent or limit shifting of the slice relative to the surface. The workpiece is maintained in a suspended condition spaced from the head as a result of the balance maintained between the weight of the workpiece, the atmospheric pressure and the sub-atmospheric pressure produced by fluid passing across the face of the workpiece that is adjacent the head. A second embodiment includes the use of a vacuum to collect the escaping air.

U.S. Pat. No. 4,566,726 (1986, Correnti et al.) discloses a semiconductor wafer pickup device that makes use of a vacuum and the Bernoulli effect in order to hold the wafer against the device and to minimize wafer contamination. The wafer pickup device includes a centrally located Bernoulli orifice and a plurality of peripherally located small tubular legs. Air is blown out of the Bernoulli orifice and out of the tubular legs. Vacuum is applied to the tubular legs while pressurized air is still blown out of the Bernoulli orifice. The combination of the Bernoulli effect with the suction at the vacuum legs locates the wafer in position where the legs hold onto it. The pressurized air is then turned off leaving the wafer held only by the vacuum legs.

Each of the prior art devices uses a pressurized air orifice to direct air perpendicularly to the surface of the part whereby the air is then laterally deflected along the surface of the part and the part is picked up. In one of the prior art devices, a crescent shaped orifice is used to bias the flow of pressurized fluid out of the orifice along a desired direction thereby moving the part along that direction. Regardless, each prior art device uses a relatively narrow and pointed stream of pressurized fluid onto the part creating a relatively small circumferential area of transition from a high pressure zone to a low pressure zone.

Therefore, what is needed is a non-contact pickup device that creates a larger circumferential area of transition from a high pressure zone to a low pressure zone.

SUMMARY OF THE INVENTION

It is an object of the present invention to provide a non-contact pickup device that utilizes a gaseous fluid for retaining a part in spaced relation with the non-contact pickup device during transport or processing of the part. It is another object of the present invention to provide a non-contact pickup device where a fluid is passed across a surface of a part with sufficient velocity to hold the part spaced from the non-contact pickup device while the gaseous fluid acts to clean, heat, dry, etch, and/or remove foreign particles or otherwise treat the surface of the part. It is yet another object of the present invention to provide a non-contact pickup device with facilities for precluding or limiting lateral shifting of a part held by the device. It is a further objective of the present invention to provide a non-contact pickup device that has a larger circumferential area of transition from a high pressure zone to a low pressure zone creating a ring of low pressure.

The present invention achieves these and other objectives by providing a non-contact pickup device having a main body, a fluid conduit, and at least one recess. One end of the main body is adapted for connection to a fluid delivery system. The opposite end, i.e. nozzle end, of the main body contains the recess. The fluid conduit communicates through the main body with the fluid delivery system and the recess. The nozzle end of the main body may have a plurality of recesses, each in communication with the fluid conduit. The recesses are typically cone shaped.

The present invention uses the Bernoulli effect to produce a low pressure area that levitates and localizes, but does not contact, the part to be handled. A source of clean fluid is blown through a rapidly diverging nozzle. The flow of fluid is channeled and accelerated by the narrow nozzle-to-part gap at the cone periphery, producing a low pressure area at that location. The low pressure area lifts the part in conjunction with atmospheric pressure at the under side of the part to be lifted. The part does not contact the nozzle as this would produce a high pressure in the throat of the nozzle rather than a sub-ambient pressure produced by the Bernoulli effect. Thus, the device is self-regulating.

The present invention is used in a nozzle having a plurality of co-planar recesses. The co-planar recesses may be arranged to be more efficient in the handling of a shaped part.

The fluid used for the non-contact pickup device of the present invention must be predominantly gaseous but may contain small droplets, mist or aerosol of liquid fluid. The droplets must be small compared with the equilibrium gap. The fluid may also incorporate various characteristics that allows the fluid to clean, heat, dry, etch, and/or remove foreign particles, or otherwise treat the surface of the part.

DETAILED DESCRIPTION OF THE PREFERRED EMBODIMENT

Figure 1:
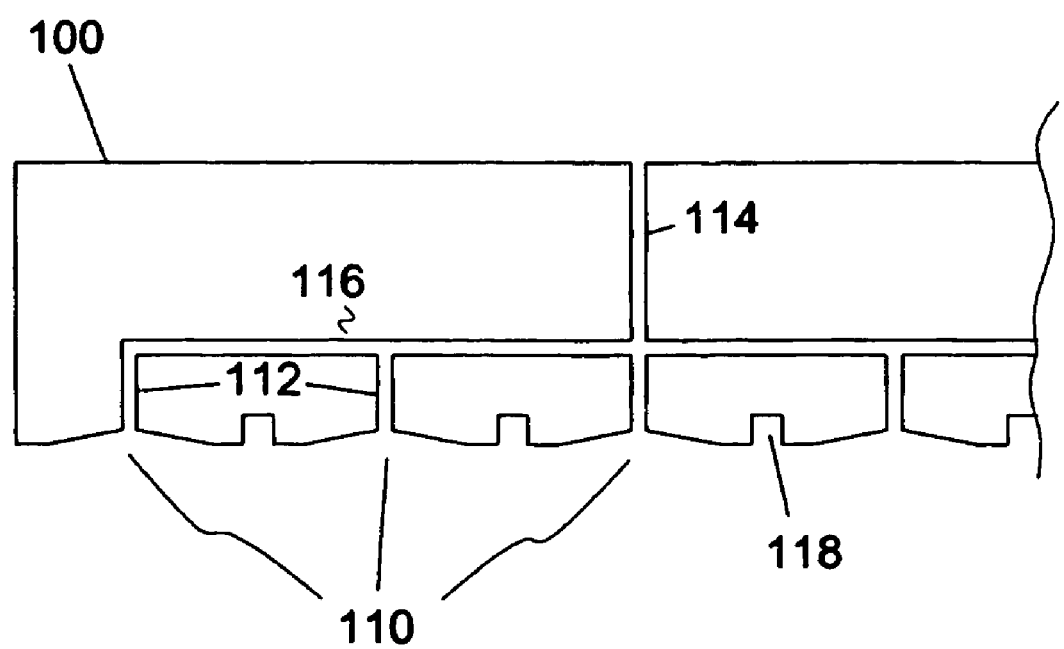
FIG. 1 illustrates a partial cross-sectional view of the present invention showing a fluid conduit communicating with a plurality of recesses.

The preferred embodiment of the present invention is illustrated in FIG. 1. FIG. 1 shows a partial cross-sectional view of nozzle 100 having a plurality of recesses 110. Nozzle 100 may comprise any shape suitable for the part to be lifted. Each recess conduit 112 is connected to a fluid conduit 114 by way of a manifold system 116 to provide the same pressurized fluid to each recess 110. A series of fluid relief channels 118 may be incorporated into the surface of the pickup surface of nozzle 100. Fluid relief channels 118 which exhaust to ambient pressure (via an additional manifold not shown) act to minimize potential fluid flow interference with the Bernoulli effect between recesses 110. Nozzle 100 may also incorporate a plurality of fixed or retractable retaining extensions (not shown) around the periphery of the nozzle as previously described. It should be understood by those skilled in the art that the nozzle's shape is not restrictive. Nozzle 100 can be any shape that meets the requirements of the part it is being used to lift.

Although the preferred embodiment of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A pressurized fluid handling nozzle comprising:
   a body having a first end and a second end, said first end configured for connection to a pressurized fluid source;
   a recess at said second end;
   a fluid conduit through said body with an inlet at said first end for receiving a pressurized fluid and an outlet at said recess for discharging said pressurized fluid; and
   a manifold having a plurality of manifold fluid conduits wherein each of said plurality of manifold conduits has a concave manifold recess, said plurality of manifold conduits connected to said pressurized fluid conduits.

2. The nozzle of claim 1 wherein said plurality of manifold recesses is located on said second end.

3. The nozzle of claim 2 wherein said plurality of manifold recesses is evenly dispersed about the surface of said second end.

4. The nozzle of claim 2 wherein said plurality of manifold recesses is dispersed about the surface of said second end in a pattern useable for a part to be handled.

* * * * *